United States Patent [19]

Yoda et al.

[11] 4,395,136

[45] Jul. 26, 1983

[54] ELECTRONIC TIMER

[75] Inventors: Kenichi Yoda, Hirakata; Hideo Togawa, Tsu; Eizou Ogawa, Ise; Masao Kayahara, Kadoma, all of Japan

[73] Assignees: Matsushita Electric Works, Ltd.; Matsushita Electric Industrial Co., Ltd., both of Osaka, Japan

[21] Appl. No.: 223,326

[22] Filed: Jan. 8, 1981

[30] Foreign Application Priority Data

Jan. 17, 1980 [JP] Japan ................................. 55-3845

[51] Int. Cl.$^3$ .............................................. G06F 1/04
[52] U.S. Cl. ................................................ 368/156
[58] Field of Search ................................ 368/85–87, 368/155–156, 185–187, 200–202, 217–219; 328/48, 59; 307/225 R, 226 R, 260, 269; 331/110–113, 143–145; 235/92 T

[56] References Cited

U.S. PATENT DOCUMENTS

| | | | |
|---|---|---|---|
| 3,745,380 | 7/1973 | Kitajima et al. | 328/59 X |
| 3,889,459 | 6/1975 | Lu | 368/156 |
| 3,979,681 | 9/1976 | Arnold | 328/48 |
| 4,001,553 | 1/1977 | Troutman et al. | 368/217 X |
| 4,094,136 | 6/1978 | Aizawa | 368/85 |

Primary Examiner—Vit W. Miska
Attorney, Agent, or Firm—Burns, Doane, Swecker & Mathis

[57] ABSTRACT

An electronic timer wherein a counting circuit for counting outputs of a CR oscillating circuit comprises a plurality of partial counting circuits which are cascade-connected with one another, the respective partial counting circuits are automatically reset by an automatic resetting circuit when a source current voltage is applied or reset by an external resetting circuit at a desired time, the outputs of the CR oscillating circuit are counted by the respective partial counting circuits after the resetting, and a following output circuit is driven when the count reaches an externally set value of a setting circuit. The partial counting circuits are divided into groups by an external driving test circuit to quickly test the operation of the counting circuit.

8 Claims, 7 Drawing Figures

ELECTRONIC TIMER

The present invention relates to electronic timers wherein oscillated outputs of a CR oscillating circuit are counted by a counting circuit comprising series-connected partial counting circuits so that a following output circuit will be driven when the counted result coincides with one of respective counts of the partial counting circuits.

There has been already suggested an electronic timer wherein the oscillated outputs of the oscillating circuit are counted by a counting circuit so that the following output circuit will be driven when the count coincides with a variable set value. With this timer, however, there has been a difficulty that much time will be required for inspecting counting operation of the counting circuit. Further, the known electronic timer has been low in the impedance and high in the electric power consumption. The present invention has been suggested in view of these defects of the conventional electronic timers.

A primary object of the present invention is, therefore, to provide an electronic timer wherein a counting circuit for counting oscillated outputs of an oscillating circuit is formed of a plurality of partial counting circuits and these partial counting circuits are divided into groups by an external driving test circuit so that counting function of the respective divided groups can be quickly inspected.

Another object of the present invention is to provide an electronic timer wherein a counting circuit for counting oscillated outputs of an oscillating circuit is reset by an automatic resetting circuit which provides a high level output upon an application of a voltage or by an external resetting circuit which is operated by an external signal at a desired time.

A related object of the present invention is to provide an electronic timer wherein an external driving circuit of the test circuit and the external resetting circuit are formed of a common circuit.

A further object of the present invention is to provide an electronic timer wherein outputs of the respective partial counting circuits are given to an output circuit through an externally set setting circuit.

A still further object of the present invention is to provide an electronic timer wherein at least a CR oscillating circuit is formed of MOS transistors, so that the oscillation characteristics will be excellent, the impedance will be high and the electric power consumption can be remarkably reduced.

Still another object of the present invention is to provide an electronic timer wherein an automatic resetting circuit comprises MOS transistors so that a resetting signal will be automatically reliably generated even when the source current voltage is unstable.

A still further object of the present invention is to provide an electronic timer wherein the common circuit of the external driving circuit of the test circuit and external resetting circuit comprise MOS transistors so as to be able to perform the driving by a single external signal.

Yet another object of the present invention is to provide an electronic timer of which the electric power consumption is reduced, manufacturing costs are decreased and various characteristics are stablized.

Other objects and advantages of the present invention will become clear upon reading the following descriptions of the invention detailed with reference to preferred embodiments thereof as shown in accompanying drawings, in which:

While the present invention shall now be explained in the followings with reference to preferred embodiments shown, the intention is not to limit the invention to the particular embodiments but is to rather include all modifications, alterations and equivalent arrangements possible within the scope of appended claims.

Figure 1:
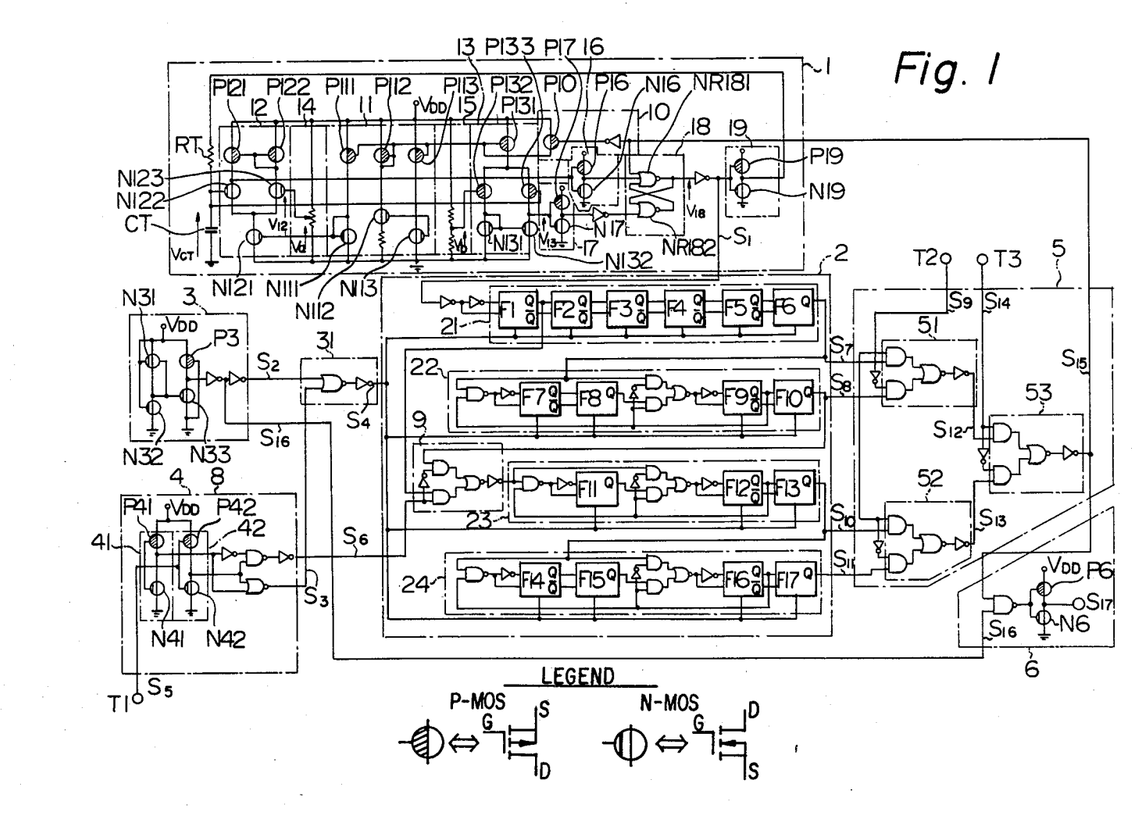
FIG. 1 shows in a single diagram a block diagram and a more specific practical circuit diagram of an electronic timer according to the present invention.

In FIG. 1 showing a practical circuit arrangement of the electronic timer of the present invention, oscillated outputs of a CR oscillating circuit 1 which starts an oscillating operation in response to an application of a voltage $V_{DD}$ are counted in a counting circuit 2 which comprises a plurality of practical counting circuits respectively comprising a plurality of flip-flops and connected in series with one another, and this counting circuit 2 is reset by an automatic resetting circuit 3 which provides a resetting signal when the voltage $V_{DD}$ is applied, or by an external resetting circuit 4 which provides a resetting signal as externally operated whenever desired. When the counted value of the counting circuit 2 reaches a set value of a setting circuit 5, the setting circuit 5 operates an output circuit 6, and a stopping circuit 10 stops the oscillating operation of the CR oscillating circuit 1. The respective partial counting circuits in the counting circuit 2 are divided into separate groups by a test circuit 9 driven by a test signal generating circuit 8 (using also the external resetting circuit 4 in the present instance) so that the counting operation can be performed in each divided group to complete the function test of the counting circuit 2 within a short time.

Figure 2:
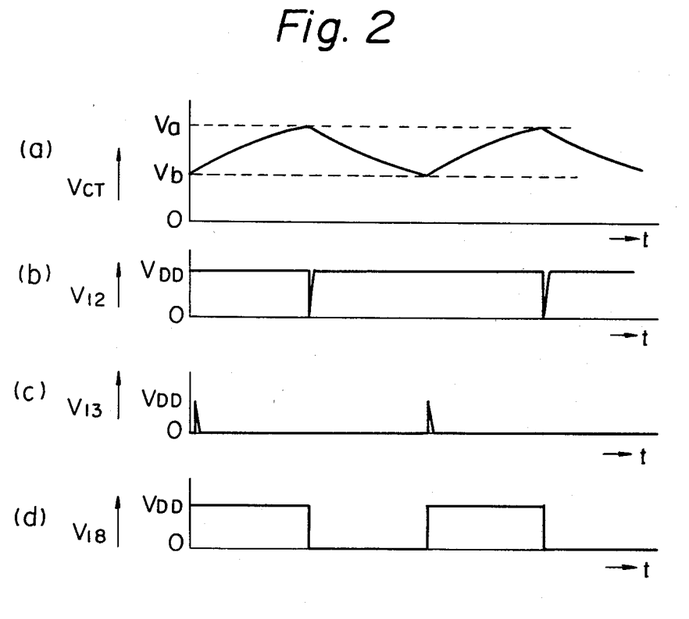
FIG. 2 is an operation explanatory view of a CR oscillating circuit in the electronic timer of FIG. 1.

In the CR oscillating circuit 1, first and second differential circuits 12 and 13 are made to be of a constant current by an N-MOS transistor N121 and P-MOS transistor P131 driven by a constant current bias circuit 11 which comprises a series circuit of P-MOS transistors P111, P112 and P113 and N-MOS transistors N111, N112 and N113. In the first differential circuit 12, the gate of an N-MOS transistor N122 connected to a direct current source $V_{DD}$ through a P-MOS transistor P121 and the N-MOS transistor N121 is connected to a time limiting capacitor CT, the gate of an N-MOS transistor N123 connected to the direct current source $V_{DD}$ through a P-MOS transistor P122 and the N-MOS transistor N121 is connected to a reference voltage circuit 14, and the gates of the P-MOS transistor P121 and P122 are connected to the source of the P-MOS transistor P122. Therefore, when the charging voltage $V_{CT}$ of the time limiting capacitor CT reaches an output voltage Va of the reference voltage circuit 14, the N-MOS transistor N122 will be made to conduct (FIG. 2(a)), so that a voltage $V_{12}$ will be provided at the output end of the first differential circuit 12, that is, the drain of the N-MOS transistor N122 (FIG. 2(b)). In the second differential circuit 13, the gate of a P-MOS transistor P132 connected to the direct current source $V_{DD}$ through a P-MOS transistor P131 and N-MOS transistor N131 is connected to a reference voltage circuit 15, the gate of a P-MOS transistor P133 connected to the direct current source $V_{DD}$ through the P-MOS transistor P131 and an N-MOS transistor N132 is connected to the time limiting capacitor CT and the gate of the N-MOS transistors N131 and N132 is connected to the drain of the N-MOS transistor N131. Therefore, when the charging voltage $V_{CT}$ of the time limiting capacitor CT reduces to an output voltage $V_b$ of the reference voltage circuit 15, the P-MOS transistor P132 will be made to conduct (FIG. 2(a)), so that a voltage $V_{13}$ will be provided at the output end of the second differential circuit 13, that is, the source of the P-MOS transistor P132 (FIG. 2 (c)). The output voltage $V_{12}$ of the first differential circuit 12 is provided to the respective gates of a P-MOS transistor P16 and N-MOS transistor N16 connected in series to each other and to the direct current source $V_{DD}$ of a first inverting circuit 16 and is, therefore, provided as inverted at the drain or output end of the N-MOS transistor N16. In the same manner, the output voltage $V_{13}$ of the second differential circuit 13 is inverted by a second inverting circuit 17 comprising a series circuit of P-MOS transistor P17 and N-MOS transistor N17. As the output of the first inverting circuit 16, that is, the voltage $V_{12}$ is given directly to the input end of a NOR circuit NR181 of an RS flip-flop 18 and the output of the second inverting circuit 17, that is, the voltage $V_{13}$ is given to the input end of the other NOR circuit NR182 of the RS flip-flop 18 through an inverting element, such output $V_{18}$ as in FIG. 2(d) will be provided at the output end of the RS flip-flop 18, that is, the output end of the NOR circuit NR181. The output $V_{18}$ of the RS flip-flop 18 is provided through an inverting element to a third inverting circuit 19 comprising P-MOS transistor P19 and N-MOS transistor N19 and, after being thereby inverted, through a time limiting resistance RT to the time limiting capacitor CT so as to eventually charge the time limiting capacitor CT with the output $V_{18}$ of the RS flip-flop 18, and thereby the charging voltage $V_{CT}$ of the time limiting capacitor CT is caused to vary as in FIG. 2(a).

In the counting circuit 2, signals $S_1$ obtained by inverting respective inverting signals $S_1$ of the output $V_{18}$ of the RS flip-flop 18 of the CT oscillating circuit 1 are counted by four partial counting circuits 21 and 24. The counting operation in these partial counting circuits 21 to 24 will be selfexplanatory in view of that the circuits 21 to 24 are respectively formed of RS flip-flops F1 to F6, F7 to F10, F11 to F13 and F14 to F17.

Figure 3:
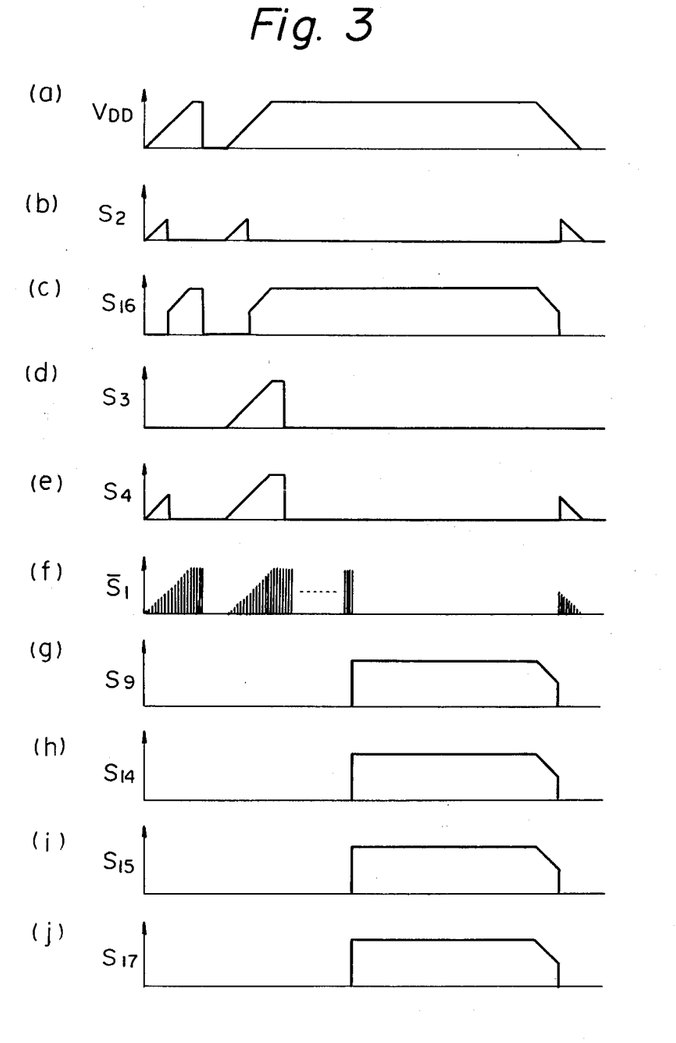
FIG. 3 is an explanatory view in wave form diagrams for the entire operation of the electronic timer of the present invention.

In the automatic resetting circuit 3, first and second N-MOS transistor N31 and N32 connected respectively at the gate to the direct current source $V_{DD}$ are connected in series to the source $V_{DD}$, and a third N-MOS transistor N33 connected at the gate to the substrate and source of the first N-MOS transistor N31 and a P-MOS transistor P3 connected at the gate to the source of the third N-MOS transistor N33 are connected to the direct current source $V_{DD}$. If the source voltage from the direct current source $V_{DD}$ varies as in FIG. 3(a) upon making of the source $V_{DD}$, therefore, the N-MOS transistors N31 and N32 and P-MOS transistor P31 conduct with the rise of the voltage and eventually a drain voltage of the N-MOS transistor N33 is provided as a signal $S_2$ through two inverting elements. The signal $S_2$ is given to the resetting ends of the respective RS flip-flops F1 and F17 in the counting circuit 2 through a selective resetting circuit 31, whereby the counting circuit 2 is positively reset when the current source is connected.

In the external resetting circuit 4, the gates of first and second P-MOS transistors P41 and P42 and the gates of first and second N-MOS transistors N41 and N42 are connected to the external input terminal T1 and series circuits of the P-MOS transistor P41 and N-MOS transistor N41 and of the P-MOS transistor P42 and N-MOS transistor N42 are counted in parallel with each other to the direct current source $V_{DD}$, the drains of the N-MOS transistors N41 and N42 are connected through a NOR circuit to the selective resetting circuit 31, so that an output signal $S_3$ is connected as a logical sum $S_4$ with the signal $S_2$ to the resetting end of the counting circuit 2 (FIG. 3 (b), (d) and (e)). When this signal $S_4$ is less than $\frac{1}{3}$ the final voltage $V_o$ of the direct current source $V_{DD}$, the signal $S_4$ given to the external input terminal T1 will not reach the threshold value of an inverting circuit 41 formed of the P-MOS transistor P41 and N-MOS transistor N41 and an inverting circuit 42 formed of the P-MOS transistor P42 and N-MOS transistor N41, so that the signal $S_3$ will be on a low level. When the signal $S_4$ is above $\frac{1}{3}$ the final voltage $V_o$, that is, above the threshold value of the inverting circuit 41 but below $\frac{2}{3}$ the final voltage, that is, below the threshold value of the inverting circuit 42, only the output of the inverting circuit 41 will be on a low level so that the signal $S_1$ will be on a low level and, when the signal $S_4$ reaches above $\frac{2}{3}$ the final voltage $V_o$, the signal $S_3$ will be on a high level. Only when a voltage signal $S_5$ above $\frac{2}{3}V_o$ is provided to the external input terminal T1, the counting circuit 2 can be reset through the selective resetting circuit 31.

In the external resetting circuit 4, further, a test signal $S_6$ is generated by taking a logical product of a signal obtained by inverting the output of the inverting circuit 41 and an output of the inverting circuit 42. That is, the external resetting circuit 4 is utilized also as a test signal generating circuit 8. As the test signal $S_6$ which will be on a high level only when the signal $S_5$ above $\frac{1}{3} V_o$ and below $\frac{2}{3} V_o$ is applied to the external input terminal T1 is provided, a test circuit 9 inserted between the respective Q output terminals of the RS flip-flop F1 of the partial counting circuit 21 and RS flip-flop F10 of the partial counting circuit 22 and the input terminal of the RS flip-flop F11 of the partial counting circuit 23 can be operated only when such signal $S_6$ is provided, to give the Q output of the RS flip-flop F1 directly to the input terminal of the RS flip-flop F11 and to prevent the transmission of the Q output of the RS flip-flop F10 to the RS flip-flop F11. This will be readily clear in view of FIG. 1.

In the setting circuit 5, either of a Q output $S_7$ of the RS flip-flop F6 in the partial counting circuit 21 and a Q output $S_8$ of the flip-flop F10 in the partial counting circuit 22 is selectively transmitted by a first AND-OR circuit 51 to the following circuit responsive to a signal $S_9$ provided to an external terminal T2. That is, when the signal $S_9$ is on a high level, a high level signal is transmitted to the following circuit upon the Q output $S_7$ of the RS flip-flop F6 of the partial counting circuit 21 which reaching a high level whereas, when the signal $S_9$ is on a low level, a high level signal is transmitted to the following circuit upon the Q output $S_8$ of the RS flip-flop F10 of the partial counting circuit 21 reaching a high level. In the same manner, a second AND-OR circuit 52 also performs a selective transmission of Q output $S_{10}$ and $S_{11}$ of the RS flip-flops F13 and F17 of the partial counting circuits 23 and 24 to the following circuit in responsive to the high or low level of the signal $S_9$. Output signals $S_{12}$ and $S_{13}$ of the first and second AND-OR circuits 51 and 52 are selectively provided as a signal $S_{15}$ in a third AND-or circuit 53 in response to the high or low level of a signal $S_{15}$ applied to an external terminal T3. In short, when the levels of the signals $S_9$ and $S_{14}$ are "high" and "high", $S_{15}=S_7$ (FIG. 3 (g) to (i)), when they are "low" and "high", $S_{15}=S_8$, when they are "high" and "low", $S_{15}=S_{10}$ and, when they are "low" and "low", $S_{15}=S_{11}$. It will be clear that a termination of set time of the electronic timer of the present invention can be properly selected as desired and that, by the combination of the test signal generating circuit 8 and test circuit 9, the function test of the counting circuit 2 can be quickly attained.

In the output circuit 6, a logical product is taken and provided out between the signal $S_{15}$ and a signal $S_{16}=S_2$ before the inversion of the output signal $S_2$ of the automatic resetting circuit 3 ($S_{17}$ of FIG. 3(i)). Here, an inverting circuit 61 comprising a series circuit of P-MOS transistor P6 and N-MOS transistor N6 is utilized and the required current is made smaller.

The signal $S_{15}$ is further presented to the stopping circuit 10 additionally provided in the CR oscillating circuit 1. As will be clear from FIG. 1, an input to this stopping circuit 10 is given directly to the input end of NOR circuit NR181 of the RS flip-flop 18 and, therefore, when the signal $S_{15}$ becomes "high", the output signal $S_1$ of the CR oscillating circuit 1 will be "high". Further, as the signal $S_{15}$ is given to the gate of a P-MOS transistor P10 through an inverting element, this transistor P10 will conduct when the signal $S_{15}$ is "high", whereby a high voltage is caused to be applied to the gate of a P-MOS transistor P131 for the constant current of the differential circuit 13 and the P-MOS transistor P131 will not conduct. In short, when the signal $S_{15}$ is "high", the CR oscillating circuit 1 stops the oscillating operation.

Further references shall be made more specifically to the CR oscillating circuit 1 of the electronic timer of the present invention.

Figure 4:
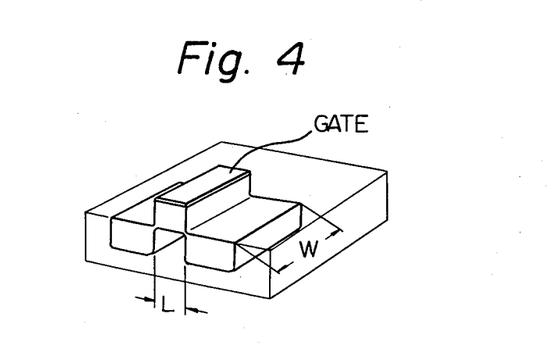
FIG. 4 is a schematic diagram of MOS transistors employed in the electronic timer of the present invention, for explaining definitions of the gate width and length.

The gate width W and gate length L of the P-MOS transistors and N-MOS transistors forming the first and second differential circuits 12 and 13 are defined as will be seen in FIG. 4. With $L=8\mu$, the gate width W is selected as in Table 1 and properly combined with the former, so that the first and second differential circuits 12 and 13 as well as the CR oscillating circuit 1 will be made, variation rate (%) of the oscillated frequency at 60° C. to the oscillated frequency at the time of the normal temperature is measured, and results have been as in Table 2:

TABLE 1

| MOS transistors | | Definitions of sizes of MOS transistors ($\mu$) | | |
|---|---|---|---|---|
| | | S (small) | M (medium) | L (large) |
| First differential circuit 12 | P121, P122 | 50 | 100 | 200 |
| | N122, N123 | 40 | 80 | 160 |
| | N121 | 30 | 60 | 120 |
| Second differential circuit 13 | P132, P133 | 80 | 160 | 320 |
| | N131, N132 | 42 | 84 | 168 |
| | P131 | 24 | 48 | 96 |

TABLE 2

| Sizes of MOS transistors | | Temperature characteristics (%) |
|---|---|---|
| First differential circuit | Second differential circuit | |
| S for all | S for all | +3.5 |
| S for all | M for all | +3.3 |
| S for all | L for all | +3.2 |
| M for all | | −1.68 |
| L for only P121, M for others | | −0.55 |
| L for only P122, M for others | | −3.02 |
| L for only N122, M for others | | −3.55 |
| L for only N123, M for others | | −0.3 |
| L for only N121, M for others | | −3.39 |
| L for all | | −0.97 |
| | M for all | +0.07 |
| | M for only N131, L for others | +0.67 |
| L for all | S for all | −1.4 |
| L for all | L for all | −1.21 |
| L for all | M for only N131, L for others | −1.22 |
| M for only P122, L for others | M for only N131, L for others | −0.7 |
| L for all | M for only N132, L for others | −0.3 |
| M for all | M for all | −1.31 |

As will be clear from Table 2, the characteristic variation due to the temperature is too large to be practicable when the size of the MOS transistors of the first and second differential circuits 12 and 13 is S. Further, in case the size of the MOS transistor is L, the MOS transistor itself is so large that there will be a difficulty that the cost will be high in rendering the transistor to be adaptable to IC. Accordingly, it becomes optimum to employ mainly the MOS transistors of the M size and to reduce the number of the MOS transistors of the L size to be used. It will be clear in view of Table 2 that, if the N-MOS transistor N123 of the first differential circuit 12 is made to be of the L size and the others are made to be the M size while all the MOS transistors of the second differential circuit 13 are made to be of the M size, the temperature characteristic will be $(-0.3)+(+0.07)=(-0.23)\%$ and the temperature characteristic of the CR oscillating circuit 1 of the present invention can be well stabilized.

While references have been made to the example that the gate length L of the MOS transistor is made $8\mu$, substantially the same effects have been obtained even the length was made to be 4 or $6\mu$, so long as the ratio of W/L was maintained to be the same as has been described above. It is also considered that, even if the gate length L is made not only 4, 6 or $8\mu$ but also 5 or $7\mu$ or the like value, the same temperature characteristic can be realized. Therefore, it will be sufficient that the gate length L of the MOS transistor is in the range of about 4 to 8μ. Further, even when the gate width W of the MOS transistor was varied by ±25% from the value in Table 1, no substantial variation in the temperature characteristic could have been observed.

Therefore, the optimum range of the ratios W/L of the gate width W to the gate length L of the MOS transistors forming the first and second differential circuits 12 and 13 is as in Table 3, and it will be clear that the optimum range of the gate length L is about 4 to 8μ.

TABLE 3

| | MOS transistors | W/L |
|---|---|---|
| First differential circuit 12 | P121, P122 | 12.5(1 − 0.25) to 12.5(1 + 0.25) |
| | N123 | 20(1 − 0.25) to 20(1 + 0.25) |
| | N122 | 10(1 − 0.25) to 10(1 + 0.25) |
| | N121 | 7.5(1 − 0.25) to 7.5(1 + 0.25) |
| Second differential circuit 13 | P132, P133 | 20(1 − 0.25) to 20(1 + 0.25) |
| | N131, N132 | 10.5(1 − 0.25) to 10.5(1 + 0.25) |
| | P131 | 6(1 − 0.25) to 6(1 + 0.25) |

In addition, the automatic resetting circuit 3 of the electronic timer of the present invention shall now be described in detail.

Figure 5:
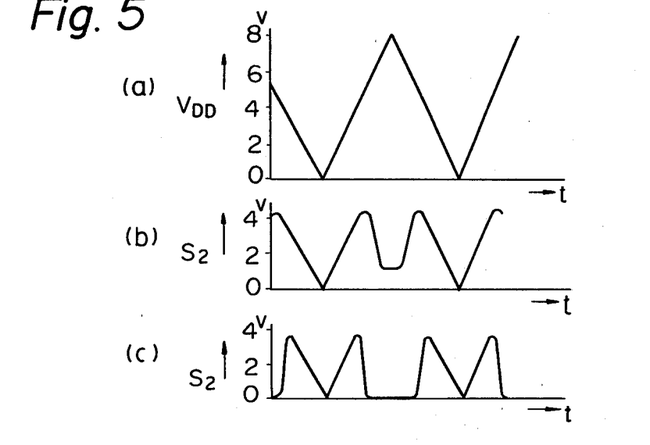
FIG. 5 is an explanatory view in wave form diagrams for operations of an automatic resetting circuit employed in the electronic timer of the present invention.

It is preferable that the impedance of the N-MOS transistor N32 and P-MOS transistor P3 is about 50 to 150 KΩ. That is, in the case when the impedance of the N-MOS transistor N32 and P-MOS transistor P3 is about 10KΩ and the output voltage of the direct current source $V_{DD}$ varies as in FIG. 5(a), the output $S_2$ of the automatic resetting circuit 3 will be as in FIG. 5(b), whereby it is confirmed experimentally that there is such a difficulty that the rise is not sharp and the output $S_2$ is not on a perfectly low level. On the other hand, in the case when the impedance is about 50 to 150 KΩ or is particularly about 100 KΩ, the output $S_2$ of the automatic resetting circuit 3 will be as in FIG. 5(c) so as to be optimum. Now, even if the impedance is made 1 MΩ, the same characteristic as in FIG. 5(c) may well be secured but a difficulty arises in that the size of the MOS transistors N32 and P3 must be large and it is not practicable. Further, when the impedance is about 10 to 50 KΩ, the tendency as in FIG. 5(b) will still remain, a difficulty that the drain current will also increase will be involved and such impedance is not preferable. Therefore, it will be clear that the impedance of the N-MOS transistor N32 and P-MOS transistor P3 of the automatic resetting circuit 3 in the present invention should preferably be about 50 to 150 KΩ.

Further, it is preferable that the ratios of W/L of the gate width W to the gate length L of the N-MOS transistors N31 and N33 are 20(1−0.5) to 20(1+0.5), and that the gate length L is about 4 to 8μ similarly to the foregoing CR oscillating circuit 1. The reason why the ratio of W/L should preferably be in the foregoing range is that experiments made with L=8μ and the values of W selected as in Table 4 have proved that the output $S_2$ of the automatic resetting circuit 3 of the present invention has varied as seen in FIG. 6 (a) to (e).

TABLE 4

Figure 6:
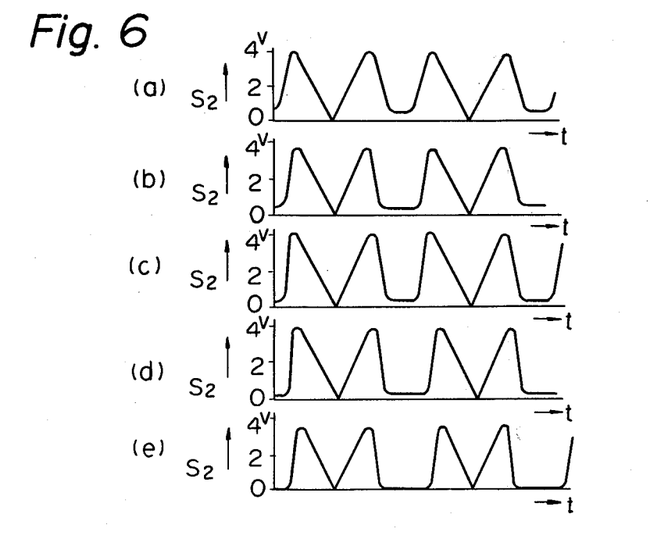
FIG. 6 is also an explanatory view in wave form diagrams for further detailed operations of the automatic resetting circuit in the electronic timer of the present invention.

| | N31 (μ) | N33 (μ) |
|---|---|---|
| FIG. 6 (a) | 160 | 42 |
| (b) | 160 | 84 |
| (c) | 42 | 160 |
| (d) | 84 | 160 |
| (e) | 160 | 160 |

In FIG. 6 (a) to (c), the rise and fall are not sharp and the output $S_2$ is not on a perfectly low level. This also occurs in FIG. 6(d) and the output $S_2$ is not on a perfectly low level. However, in FIG. 6(e), the rise and fall are sharp and the output $S_2$ is on a perfectly low level. It will be clear that the case of FIG. 6(e) is optimum in view of results of the above experiments and in order to avoid the foregoing difficulty that the MOS transistor must be large.

While the references have been made to the example in which the gate length L of the MOS transistor is made 8μ, the same effects could have been obtained even when the length is made 4 or 6μ so long as the W/L ratio is maintained to be the same as above. It is considered that, even if the gate length L is not only 4, 6 or 8μ but also 5 or 7μ or the like value, the same temperature characteristic will be realized. Therefore, the gate length L of the MOS transistor will be satisfactory if the same is in the range of about 4 to 8μ. Also, it is found that, even if the gate width W of the MOS transistor is varied by ±50% from the value in Table 4, the output substantially stabilized against any fluctuation in the source voltage can be provided by the automatic resetting circuit in the present invention.

In the automatic resetting circuit 3 of the electronic timer of the present invention, the substrate of the N-MOS transistor N31 is connected to the source. Therefore, it will be clear that the temperature characteristic is thereby improved.

Figure 7:
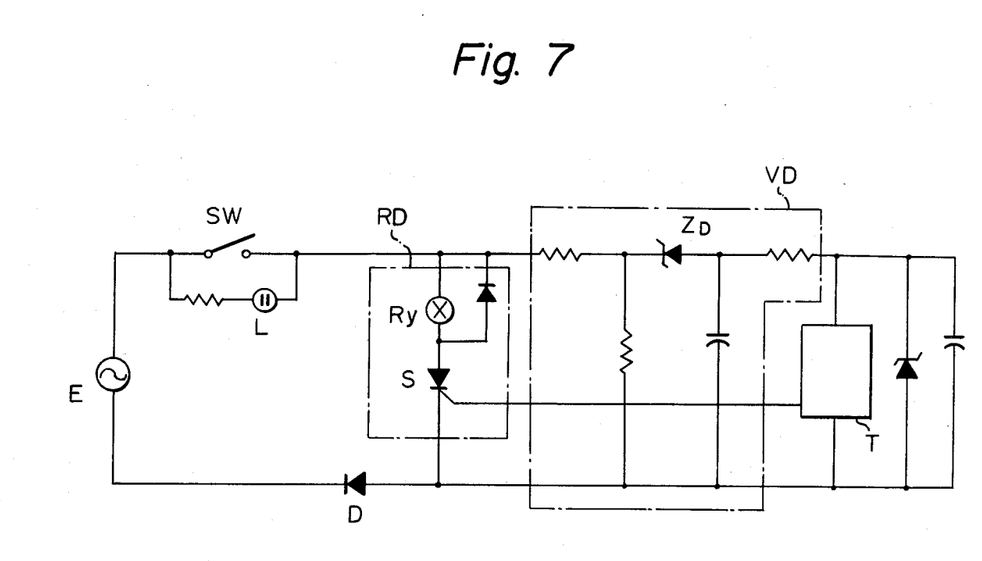
FIG. 7 shows in a circuitry diagram an electronic timer device utilizing the electronic timer of the present invention.

As will be clear from the foregoing disclosures, the electronic timer of the present invention is formed of MOS transistors and is high in the impedance. Therefore, in the case when a relay driving circuit RD comprising a relay coil $R_Y$ and thylistor S and connected to an AC source E through a diode D and switch SW to the latter of which an indicating lamp L is parallelly connected is driven by the electronic timer T of the present invention connected to the output end of a voltage reducing circuit VD connected in parallel with the relay driving circuit RD as in FIG. 7, any mis-operation of the electronic timer T of the present invention can be effectively prevented if a Zener diode $Z_D$ is inserted in the voltage reducing circuit VD and any feeble current flowing through the indicating lamp L when the switch SW is opened is prevented from being given to the electronic timer T. In other words, the saving of the electric power consumption by means of the high impedance of the electronic timer T of the present invention is favorably attained and the mis-operation of the electronic timer device utilizing the electronic timer T of the present invention is well eliminated by arranging the element for preventing the feeble current in the current source circuit to the electronic timer T of the present invention.

What is claimed is:

1. An electronic timer comprising a CR oscillating circuit, a counting circuit including a plurality of partial counting circuits connected in cascade to one another for counting oscillated outputs of said CR oscillating circuit, an output circuit driving an associated following circuit in response to an output selected out of outputs from one of said partial counting circuits in the final stage of said cascade connection, an automatic resetting circuit for automatically resetting said plurality of partial counting circuits of said counting circuit upon an application of a source current, an external resetting circuit for resetting the partial counting circuits in response to an external signal, a test circuit for dividing said plurality of partial counting circuits into a plurality of groups, and a test signal generating circuit for inspecting the function of each of said divided groups by externally driving said test circuit, said external resetting circuit and said test signal generating circuit being formed of a common circuit comprising first and second inverting circuits receiving a common external signal and respectively having a low inverting threshold value and a high inverting threshold value so that, when said external signal reaches only said low inverting threshold value, a signal driving said test circuit will be provided and, when the external signal reaches said high inverting threshold value, an external resetting signal resetting said plurality of partial counting circuits of said counting circuit will be provided.

2. An electronic timer according to claim 1 wherein said CR oscillating circuit is stopped in response to an input to said output circuit.

3. An electronic timer according to claim 2 wherein said CR oscillating circuit is formed of MOS transistors.

4. An electronic timer according to claim 3 wherein said CR oscillating circuit comprises a capacitor, a first differential circuit providing an output in response to a high charging voltage of said capacitor, a second differential circuit providing an output in response to a low charging voltage of the capacitor, an RS flip-flop actuated in response to said outputs of said first and second differential circuits and providing an output to said counting circuit, and a resistance charging and discharging said capacitor in response to said output of said RS flip-flop.

5. An electronic timer according to claim 4 wherein said first differential circuit comprises a first series circuit of a first P-MOS transistor and first N-MOS transistor connected at the gate to said capacitor, a second series circuit of a second P-MOS transistor connected at the gate to the gate of said first P-MOS transistor and its own source and second N-MOS transistor connected at the gate to a constant voltage source and a third N-MOS transistor inserted between said first and second series circuits and a direct current source, and said second differential circuit comprises a third series circuit of a third P-MOS transistor connected at the gate to another constant voltage source and fourth N-MOS transistor, a fourth series circuit of a fourth P-MOS transistor connected at the gate to the capacitor and fifth N-MOS transistor connected at the gate to the source and gate of said fourth N-MOS transistor and a fifth P-MOS transistor inserted between said third and fourth series circuits and a direct current source.

6. An electronic timer according to claim 5 wherein the ratios W/L of the gate width W to the gate length L of said first to fifth P-MOS transistors and first to fifth N-MOS transistors are respectively substantially in the range of 12.5(1+0.25), 12.5(1+0.25), 20(1+0.25), 20(1+0.25), 6(1+0.25), 10(1+0.25), 20(1+0.25), 7.5(1+0.25), 10.5(1+0.25) and 10.5(1+0.25), and said gate length L is about 4 to 8μ.

7. An electronic timer according to claim 2 wherein said automatic resetting circuit comprises a fifth series circuit of a sixth N-MOS transistor connected at the gate to a direct current source and at the substrate to its own source and seventh N-MOS transistor connected at the gate to said direct current source and a sixth series circuit of a sixth P-MOS transistor earthed at the gate and eighth N-MOS transistor connected at the gate to the source of said sixth N-MOS transistor.

8. An electronic timer according to claim 7 wherein said sixth P-MOS transistor and seventh N-MOS transistor are of an impedance of about 50 to 150 KΩ, the ratio W/L of the gate width W to the gate length L of said sixth and eighth N-MOS transistors is substantially in the range of 20(1+0.5), and said gate length L is about 4 to 8μ.

* * * * *